(12) United States Patent
Shaviv et al.

(10) Patent No.: US 12,148,660 B2
(45) Date of Patent: Nov. 19, 2024

(54) LOW RESISTANCE AND HIGH RELIABILITY METALLIZATION MODULE

(71) Applicant: Applied Materials, Inc., Santa Clara, CA (US)

(72) Inventors: Roey Shaviv, Palo Alto, CA (US); Suketu Arun Parikh, San Jose, CA (US); Feng Chen, San Jose, CA (US); Lu Chen, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 96 days.

(21) Appl. No.: 17/487,123

(22) Filed: Sep. 28, 2021

(65) Prior Publication Data

US 2022/0108917 A1   Apr. 7, 2022

Related U.S. Application Data

(60) Provisional application No. 63/087,969, filed on Oct. 6, 2020.

(51) Int. Cl.
*H01L 21/768* (2006.01)
*H01L 21/02* (2006.01)

(52) U.S. Cl.
CPC .. *H01L 21/76847* (2013.01); *H01L 21/02115* (2013.01); *H01L 21/76814* (2013.01); *H01L 21/76879* (2013.01); *H01L 21/76883* (2013.01)

(58) Field of Classification Search
CPC .................................................. H01L 21/76847
See application file for complete search history.

(56) References Cited

U.S. PATENT DOCUMENTS

| | | | |
|---|---|---|---|
| 5,278,100 A | 1/1994 | Doan | |
| 5,956,608 A * | 9/1999 | Khurana | H01L 21/76862 438/653 |
| 6,107,192 A * | 8/2000 | Subrahmanyan | H01L 21/76843 257/E21.582 |
| 6,372,633 B1 | 4/2002 | Maydan et al. | |
| 6,785,159 B2 | 8/2004 | Tuttle | |
| 6,900,539 B2 | 5/2005 | Motoyama | |
| 8,232,148 B2 | 7/2012 | Li et al. | |
| 8,357,609 B2 | 1/2013 | Ryan | |
| 9,299,704 B2 | 3/2016 | Ji et al. | |

(Continued)

FOREIGN PATENT DOCUMENTS

| | | |
|---|---|---|
| EP | 1120474 A1 | 8/2001 |
| JP | H1092924 A | 4/1998 |

(Continued)

OTHER PUBLICATIONS

Chen, Xi , et al., "Divide and Protect: Passivating Cu(111) by Cu-(benzotriazole)2", The Journal of Physical Chemistry 2012, 116, Oct. 5, 2012, 222346-22349.

(Continued)

*Primary Examiner* — Erik Kielin
(74) *Attorney, Agent, or Firm* — Servilla Whitney LLC

(57) ABSTRACT

Provided are methods of forming vias with decreased resistance by selectively depositing a barrier layer on an insulating layer and not on a metallic surface. Some embodiments of the disclosure utilize a planar hydrocarbon to form a blocking layer on metallic surfaces. Deposition is performed to selectively deposit on the unblocked insulating surfaces.

10 Claims, 13 Drawing Sheets

(56) References Cited

U.S. PATENT DOCUMENTS

| | | |
|---|---|---|
| 9,362,385 B2 | 6/2016 | Cheng et al. |
| 10,643,895 B2 | 5/2020 | Mebarki et al. |
| 2003/0017268 A1 | 1/2003 | Hu et al. |
| 2003/0072884 A1 | 4/2003 | Zhang et al. |
| 2004/0013803 A1 | 1/2004 | Chung et al. |
| 2007/0238279 A1 | 10/2007 | Cerio, Jr. |
| 2008/0194102 A1 | 8/2008 | Usami et al. |
| 2009/0032766 A1 | 2/2009 | Rajaratnam et al. |
| 2009/0074983 A1 | 3/2009 | Heys et al. |
| 2009/0215269 A1 | 8/2009 | Boggs et al. |
| 2013/0313648 A1 | 11/2013 | Chiang et al. |
| 2013/0337659 A1 | 12/2013 | Ahn et al. |
| 2016/0163586 A1 | 6/2016 | Siew et al. |
| 2016/0268207 A1 | 9/2016 | Naik et al. |
| 2017/0256488 A1 | 9/2017 | Lee et al. |
| 2018/0158686 A1 | 6/2018 | Gelatos et al. |
| 2019/0109009 A1 | 4/2019 | Longrie et al. |
| 2020/0035546 A1 | 1/2020 | Kuo et al. |
| 2020/0105515 A1 | 4/2020 | Maes et al. |
| 2020/0105592 A1 | 4/2020 | Kuo et al. |
| 2020/0144107 A1* | 5/2020 | Dutta ............... H01L 21/76816 |
| 2022/0037202 A1* | 2/2022 | Lin .................. H01L 21/76834 |
| 2022/0068826 A1* | 3/2022 | Kuo ................. H01L 21/76804 |
| 2022/0399229 A1* | 12/2022 | Na ................... H01L 21/76877 |

FOREIGN PATENT DOCUMENTS

| | | |
|---|---|---|
| JP | H10116800 A | 5/1998 |
| KR | 100936490 B1 | 1/2010 |
| KR | 20120037653 A | 4/2012 |
| TW | 202029410 A | 8/2020 |
| WO | 2016073707 A1 | 5/2016 |
| WO | 2019018379 A1 | 7/2018 |
| WO | 2019060413 A1 | 3/2019 |

OTHER PUBLICATIONS

Farm, Elina, et al., "Passivation of copper surfaces for selective-area ALD using a thiol self-assembled monolayer", Semiconductor Science and Technology 27 (2012) 074004, Jun. 22, 2012, 5 pages.

Kokalj, Anton, et al., "Density Functional Theory Study of ATA, BTAH, and BTAOH as Copper Corrosion Inhibitors: Adsorption onto Cu(111) from Gas Phase", Langmuir 2010, 26 (18), Aug. 23, 2010, 14582-14593.

Kokalj, Anton, et al., "The Effect of Surface Geometry of Copper on Dehydrogenation of Benzotriazole. Part II", The Journal of Physical Chemistry 2014, 188, Dec. 12, 2013, 944-954.

Kokalj, Anton, et al., "What Determines the Inhibition Effectiveness of ATA, BTAH, and BTAOH Corrosion Inhibitors on Copper?", Journal of the American Chemical Society 2010, 132, Oct. 29, 2010, 16657-16668.

Kuznetsov, Yu. I., et al., "Adsorption and passivation of copper by triazoles in neutral aqueous solution", Int. J. Corros. Scale Inhib., 2014, 3, No. 2,, Mar. 13, 2014, 137-148.

Peljhan, Sebastijan, et al., "The Effect of Surface Geometry of Copper on Adsorption of Benzotriazole and CI. Part I", The Journal of Physical Chemistry 2014, 118, Dec. 12, 2013, 933-943.

Pena, Luis Fabian, et al., "Vapor-Phase Cleaning and Corrosion Inhibition of Copper Films by Ethanol and Heterocyclic Amines", American Chemical Society: Applied Materials & Interfaces 2018, 10, Oct. 18, 2018, 38610-38620.

PCT International Search Report and Written Opinion in PCT/US2021/053304 dated Jan. 24, 2022, 11 pages.

\* cited by examiner

LOW RESISTANCE AND HIGH RELIABILITY METALLIZATION MODULE

CROSS-REFERENCE TO RELATED APPLICATIONS

This application claims priority to U.S. Provisional Application No. 63/087,969, filed Oct. 6, 2020, the entire disclosure of which is hereby incorporated by reference herein.

TECHNICAL FIELD

Embodiments of the disclosure pertain to the field of electronic device manufacturing, and in particular, to an integrated circuit (IC) manufacturing. More particularly, embodiments of the disclosure are directed to methods of producing electronic devices with low resistance and high reliability in narrow features.

BACKGROUND

Generally, an integrated circuit (IC) refers to a set of electronic devices, e.g., transistors formed on a small chip of semiconductor material, typically, silicon. Typically, the IC includes one or more layers of metallization having metal lines to connect the electronic devices of the IC to one another and to external connections. Typically, layers of the interlayer dielectric material are placed between the metallization layers of the IC for insulation.

As the size of the IC decreases, the spacing between the metal lines decreases. Typically, to manufacture an interconnect structure, a planar process is used that involves aligning and connecting one layer of metallization to another layer of metallization.

Reducing the resistance of the via is critical for improved performance of the electronic device. The via resistance reduction is usually controlled by minimizing cladding and by reducing the resistivity of the via material. Thus, there is a need for a method of reducing via resistance.

SUMMARY

One or more embodiments of the disclosure are directed to a method of forming an electronic device. The method comprises: providing a substrate comprising an insulating layer on a first metallization layer, the insulating layer comprising an opening extending from a top surface of the insulating layer to the first metallization layer, the opening having at least one sidewall, a top portion, and a bottom portion; depositing a metal layer in the bottom portion of the opening, the metal layer extending to the first metallization layer; selectively depositing a barrier layer on the at least one sidewall of the opening and not on the metal layer; and forming a second metallization layer in the top portion of the opening on the metal layer and on the barrier layer.

Additional embodiments of this disclosure relate to a method of forming an electronic device. The method comprises: providing a substrate comprising an insulating layer on a first metallization layer, the insulating layer comprising an opening extending from a top surface of the insulating layer to the first metallization layer; depositing a metal layer in the opening, the metal layer extending to the first metallization layer; selectively depositing a barrier layer on the top surface of the insulating layer and not on the metal layer; forming a second metallization layer on the metal layer and on the barrier layer; and etching the second metallization layer to form a trench.

Other embodiments of this disclosure relate to a method of forming an electronic device. The method comprises: providing a substrate comprising a first insulating layer on metal layer, the metal layer on a first metallization layer; depositing an etch stop layer on a top surface of the first insulating layer and a top surface of the metal layer; depositing a second insulating layer on a top surface of the etch stop layer; performing a single damascene process to form an opening extending from a top surface of the second insulating layer to the top surface of metal layer; selectively depositing a barrier layer in the opening not on the metal layer; and forming a second metallization layer on the metal layer and on the barrier layer.

Further embodiments of this disclosure relate to a processing tool. In one or more embodiments, a processing tool comprises: a pre-clean chamber having a substrate support therein; a selective metal deposition chamber; a barrier metal deposition chamber; a metal deposition chamber; a PVD metal deposition chamber; a CVD metal deposition chamber; optionally, a blocking layer deposition chamber with an optional pre-clean; optionally, a liner metal deposition chamber; optionally, a plasma chamber; optionally, an etching chamber; a robot configured to access the pre-clean chamber, the selective deposition chamber, the optional blocking layer deposition chamber, the barrier metal deposition chamber, the PVD metal deposition chamber, the optional plasma chamber; and the optional etching chamber, the optional liner metal deposition chamber, the CVD metal deposition chamber and the PVD metal deposition chamber; and a controller connected to the pre-clean chamber, the selective deposition chamber, the optional blocking layer deposition chamber, the barrier metal deposition chamber, the PVD metal deposition chamber, the optional plasma chamber; and the optional etching chamber, the optional liner metal deposition chamber, the CVD metal deposition chamber and the PVD metal deposition chamber, and the robot, the controller having one or more configurations selected from: cleaning a substrate, selectively forming a blocking layer, selectively depositing a liner, optionally forming a metal liner, forming a metallization layer, optional etching the substrate, and, optionally removing the blocking layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
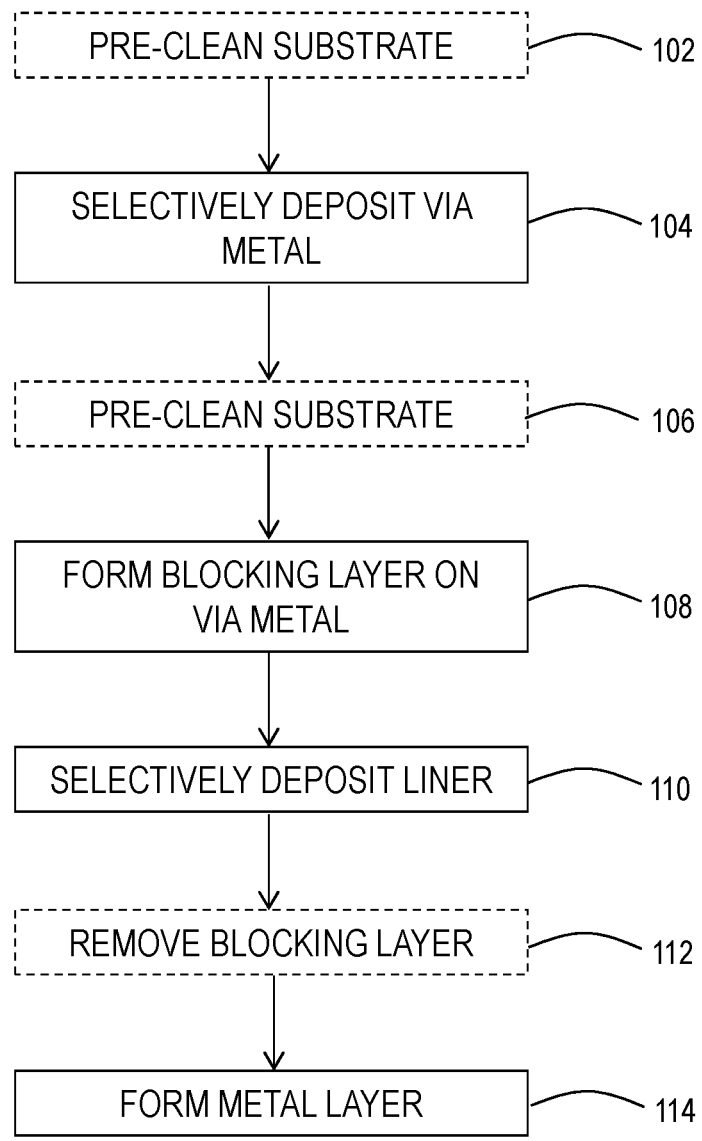
FIG. 1 illustrates a process flow diagram of a method according to one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

As used in this specification and the appended claims, the term "selectively depositing on a first surface over a second surface", and the like, means that a first amount or thickness is deposited on the first surface and a second amount or thickness is deposited on the second surface, where the second amount or thickness is less than the first amount or thickness, or, in some embodiments, no amount is deposited on the second surface.

As used in this regard, the term "over" does not imply a physical orientation of one surface on top of another surface, rather a relationship of the thermodynamic or kinetic properties of the chemical reaction with one surface relative to the other surface. For example, selectively depositing a cobalt film onto a copper surface over a dielectric surface means that the cobalt film deposits on the copper surface and less or no cobalt film deposits on the dielectric surface; or that the formation of the cobalt film on the copper surface is thermodynamically or kinetically favorable relative to the formation of a cobalt film on the dielectric surface.

In some embodiments, "selectively" means that the subject material forms on the selected surface at a rate greater than or equal to about 2×, 3×, 4×, 5×, 7×, 10×, 15×, 20×, 25×, 30×, 35×, 40×, 45× or 50× the rate of formation on the non-selected surface. Stated differently, the selectivity of the stated process for the selected surface relative to the non-selected surface is greater than or equal to about 2:1, 3:1, 4:1, 5:1, 7:1, 10:1, 15:1, 20:1, 25:1, 30:1, 35:1, 40:1, 45:1 or 50:1.

According to one or more embodiments, the method uses an atomic layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reagent, although there may be some overlap. As used in this specification and the appended claims, the terms "precursor", "reactant", "reactive gas" and the like are used interchangeably to refer to any gaseous species that can react with the substrate surface.

A metal can be grown by atomic layer deposition for many applications. One or more embodiments of the disclosure advantageously provide processes for atomic layer deposition to form metal-containing films. As used in this specification and the appended claims, the term "metal-containing film" refers to a film that comprises metal atoms and has greater than or equal to about 1 atomic % metal, 2 atomic % metal, 3 atomic % metal, 4 atomic % metal, 5 atomic % metal, 10 atomic % metal, 15 atomic % metal, 20% atomic metal, 25% atomic metal, 30% atomic metal, 35% atomic metal, 40% atomic metal, 45% atomic metal, or 50% atomic metal. In some embodiments, the metal-containing film comprises one or more of a metal, a metal nitride, a metal carbide, or a metal oxide. The skilled artisan will recognize that the use of molecular formula like MO, where M is a metal, does not imply a specific stoichiometric relationship between the elements but merely the identity of the major components of the film. For example, MO refers to a film whose major composition comprises a metal and oxygen atoms. In some embodiments, the major composition of the specified film (i.e., the sum of the atomic percent of the specified atoms) is greater than or equal to about 95%, 98%, 99% or 99.5% of the film, on an atomic basis.

In some embodiments, selective deposition comprises a combination of deposition and etch processes. For example, a barrier layer may be selectively deposited on a dielectric material over a metal forming a thin layer on the metal. A subsequent etch process, also referred to as a selective etch process, in some embodiments is used to remove the barrier layer from the conductive material at a faster rate than removal from the dielectric material to complete the selective deposition.

As used herein, the term "barrier layers" refers to a film that prevents diffusion of material across itself. As used herein, the term "liner" refers to a film, typically used over a barrier layer, which assists in the integrity and reliability of the film that it is deposited over. In some embodiments, both a barrier layer and a liner are formed. In other embodiments, no liner is formed.

One or more embodiments of this disclosure are directed to methods of selectively forming a blocking layer on a metal layer over (i.e., not on) an insulating. One or more embodiments of this disclosure provide methods of selectively forming a barrier layer on an insulating layer over (i.e., not on) a metallic surface or metal layer. The method of one or more embodiments is an integrated process performed in a processing tool without breaking vacuum.

The metal layer or metallic material of one or more embodiments may be any suitable metallic material. In some embodiments, the metallic materials of this disclosure are conductive materials. Suitable metallic materials include, but are not limited to, metals, conductive metal nitrides, conductive metal oxides, metal alloys, silicon, combinations thereof and other conductive materials.

In one or more embodiments, the metal or metallic material may comprise any suitable metal known to the skilled artisan. In some embodiments, the metal or metallic material is selected from one or more of copper (Cu), cobalt (Co), ruthenium (Ru), iridium (Ir), rhodium (Rh), molybdenum (Mo), tungsten (W), aluminum (Al), nickel (Ni), and platinum (Pt). In some embodiments, the metal or metallic material consists essentially of copper (Cu), cobalt (Co), ruthenium (Ru), iridium (Ir), rhodium (Rh), molybdenum (Mo), tungsten (W), aluminum (Al), nickel (Ni), or platinum (Pt). In some embodiments, the metal or metallic material consists essentially of copper, cobalt, ruthenium, tungsten, or molybdenum. In some embodiments, the metallic material comprises or consists essentially of copper. As used in this specification and the appended claims, the term "consists essentially of" means that the material is greater than or equal to about 95%, 98% or 99% of the stated material on an atomic basis.

As used in this specification and the appended claims, the term "oxide" or the like means that the material contains the specified element(s). The term should not be interpreted to imply a specific ratio of elements. Accordingly, an "oxide" or the like may comprise a stoichiometric ratio of elements or a non-stoichiometric ratio of elements.

Methods to form an electronic device having a self-aligned via and processing tools to perform the methods are described. With reference to FIG. 1, which is a process flow diagram, one or more embodiments of the disclosure are directed to a method 100 of forming an electronic device. The method illustrated in FIG. 1 is representative of an integrated process. In some embodiments, the method 100 includes a pre-cleaning operation 102. The pre-cleaning operation can be any suitable pre-cleaning process known to the skill artisan. Suitable pre-cleaning operations include, but are not limited to, soaking, native oxide remove, and the like.

FIGS. 2A thru 2F illustrate cross-sectional views of an exemplary device 200 during the processing method 100 according to one or more embodiments of the disclosure. A substrate 202 is provided having an insulating layer 208 thereon. As used in this specification and the appended claims, the term "provided" means that the device 200 with the substrate 202 is made available for processing (e.g., positioned in a processing chamber). In some embodiments, an etch stop layer 206 is on the top surface of the substrate 202 between the substrate 202 and the insulating layer 208. In one or more embodiments, the etch stop layer 206 may comprise any suitable material known to the skilled artisan. In one or more embodiments, the etch stop layer 206 may comprise one or more of silicon nitride (SiN), silicon carbide (SiC), aluminum oxide (AlO$_x$), and aluminum nitride (AlN). In some embodiments, the etch stop layer 206 may be deposited using a technique selected from CVD, PVD, and ALD.

In one or more embodiments, the insulating layer 208 has an opening 211 extending from a top surface 209 of the insulating layer 208 to a first metallization layer 204. In one or more embodiments, the opening 211 has at least one sidewall 213, a top portion 212, and a bottom portion 210. In some embodiments, the bottom portion 210 may be referred to as a via opening, and the top portion 212 may be referred to as a trench. As used herein, the term "aspect ratio" of an opening, a trench, a via, and the like refers to the ratio of the depth of the opening to the width of the opening. In one or more embodiments, the aspect ratio of each bottom portion 210, or via opening, is in an approximate range from about 1:1 to about 200:1. In some embodiments, the aspect ratio of the bottom portion 210, or via opening, is at least 2:1. In other embodiments, the aspect ratio of the bottom portion 210, or via portion, is at least 5:1, or at least 10:1.

As used herein, the term "insulating layer" or "insulating material" or the like refers any material suitable to insulate adjacent devices and prevent leakage. In one or more embodiments, the insulating layer 208 is an oxide layer, e.g., silicon dioxide, or any other electrically insulating layer determined by an electronic device design. In one or more embodiments, the insulating layer 208 comprises an interlayer dielectric (ILD). In one or more embodiments, the insulating layer 208 is a low-κ dielectric that includes, but is not limited to, materials such as, e.g., silicon dioxide, silicon oxide, carbon doped oxide ("CDO"), e.g., carbon doped silicon dioxide, porous silicon dioxide (SiO$_2$), silicon nitride (SiN), silicon carbide (SiC), or any combination thereof.

In one or more embodiments, the insulating layer 208 includes a dielectric material having a κ-value less than 5. In one or more embodiments, insulating layer 208 includes a dielectric material having a κ-value less than 3. In at least some embodiments, the insulating layer 208 includes oxides, carbon doped oxides, porous silicon dioxide, carbides, oxycarbides, nitrides, oxynitrides, oxycarbonitrides, polymers, phosphosilicate glass, fluorosilicate (SiOF) glass, organosilicate glass (SiOCH), or any combinations thereof, other electrically insulating materials determined by an electronic device design, or any combination thereof. In at least some embodiments, the insulating layer 208 may include polyimide, epoxy, photodefinable materials, such as benzocyclobutene (BCB), and WPR-series materials, or spin-on-glass.

In one or more embodiments, the insulating layer 208 is a low-κ interlayer dielectric to isolate one metallization layer or metal line 204 from other metal lines on the substrate 202. In one or more embodiments, the thickness of the insulating layer 208 is in an approximate range from about 10 nanometers (nm) to about 2 microns (μm).

In an embodiment, the insulating layer 208 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing.

In some embodiments, an etch stop layer 206 is deposited on the top surface of the substrate 202 and the first metallization layer 204. In some embodiments, not illustrated, a mask layer is formed on the insulating layer 208. The insulating layer 208 may by etched to form the opening 211, the at least one via opening 210 having a bottom surface comprising an exposed portion of the etch stop layer 206. In one or more embodiments, the etch stop layer 206 exposed through the via opening 210 is selectively removed so that the bottom surface of the via opening 210 comprises the first metallization layer 204.

Figure 2A:
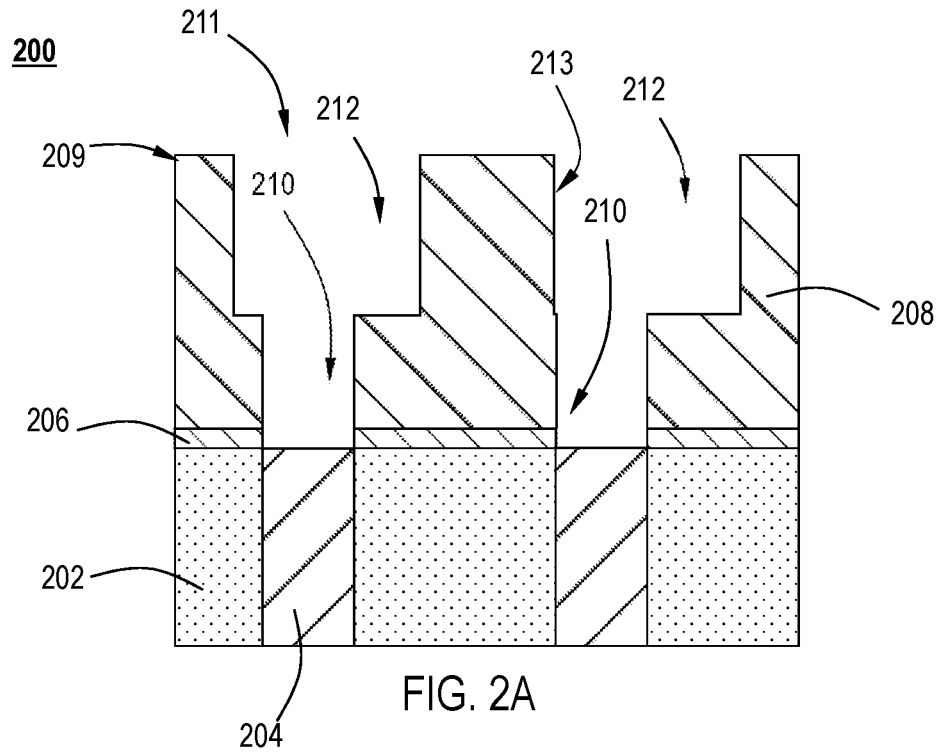
FIGS. 2A-2F illustrate cross-sectional views of an exemplary substrate during processing according to one or more embodiments of the disclosure.
Figure 2B:
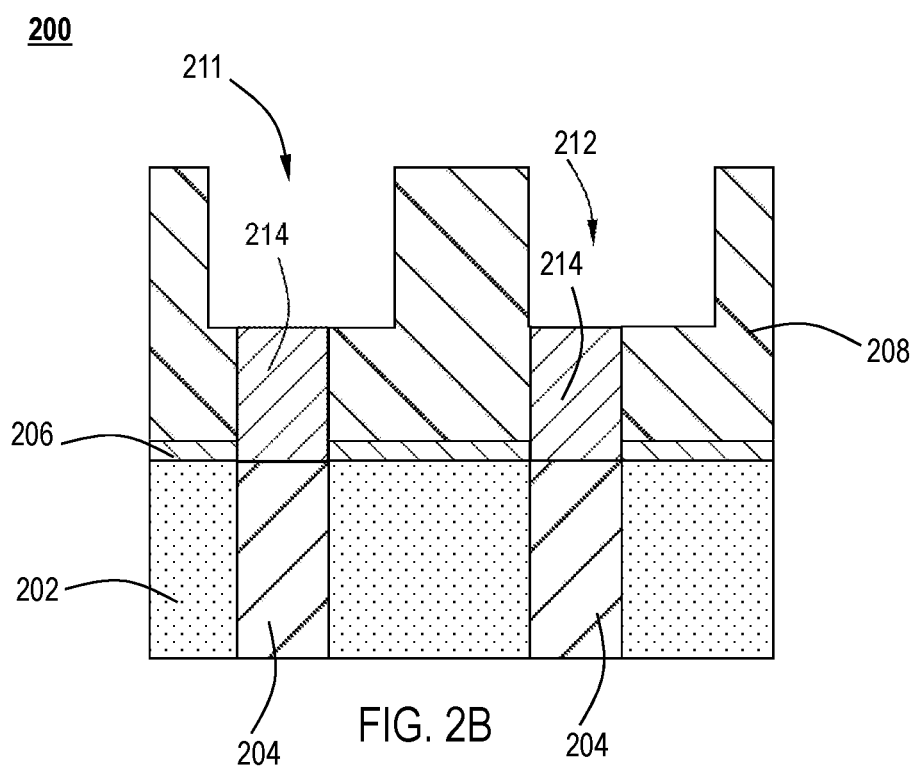

Referring to FIG. 1 and FIG. 2B, at operation 104, a metal layer 214 is formed or deposited in the opening 211. In some embodiments, the metal layer 214 is deposited in the bottom portion 210 (or via opening) of the insulating layer. In one or more embodiments, the metal layer 214 extends to the first metallization layer 204. In some embodiments, the metal layer 214 does not form in the trench or top portion 212 of the opening 211.

In one or more embodiments, the first metallization layer 204 comprises a metal selected from one or more of copper (Cu), cobalt (Co), ruthenium (Ru), iridium (Ir), rhodium (Rh), molybdenum (Mo), tungsten (W), aluminum (Al), nickel (Ni), and platinum (Pt). In specific embodiments, the first metallization layer 204 comprises copper (Cu) or cobalt (Co).

In one or more embodiments, the metal layer 214 comprises a metal selected from one or more of cobalt (Co), ruthenium (Ru), molybdenum (Mo), and tungsten (W). In some embodiments, the metal layer 214 comprises a different metal than the first metallization layer 204. In one or more specific embodiments, the metal layer 214 comprises tungsten (W).

At operation 106, the device 200 may be optionally pre-cleaned. The pre-cleaning operation can be any suitable pre-cleaning process. Suitable pre-cleaning operations include, but are not limited to, plasma clean, remote plasma clean, soaking, soaking in a reducing vapor, native oxide remove, and the like. For example, in one or more embodiments, the device 200 is pre-cleaned to remove native oxide from the top surface of the metal layer 214.

Figure 2C:
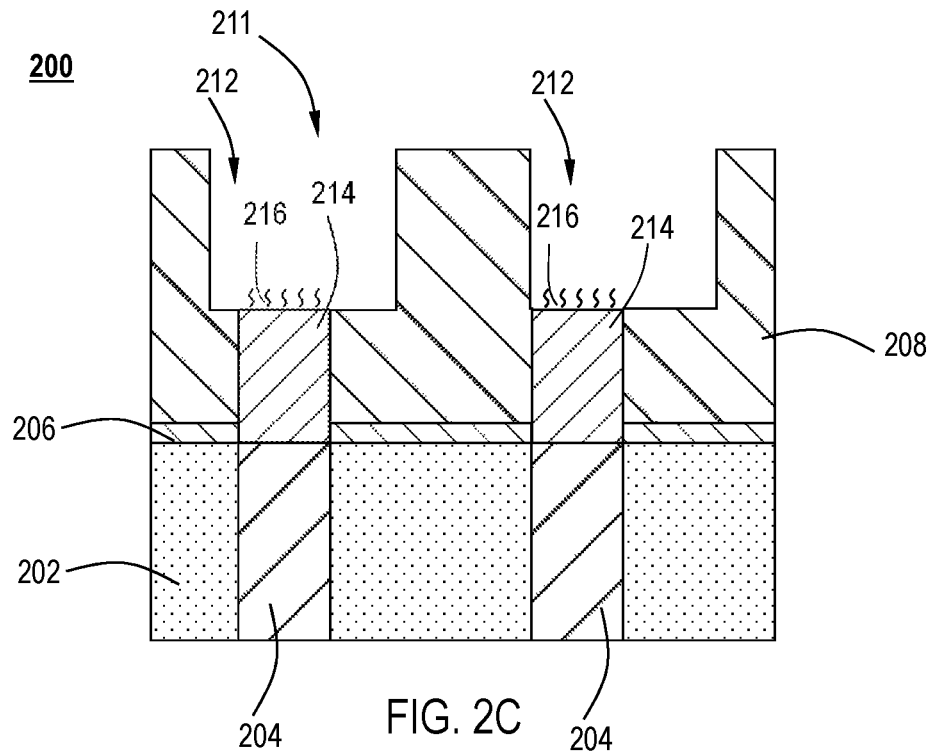

With reference to FIG. 1 and to FIG. 2C, at operation 108, a blocking layer 216 is formed selectively on the top surface of the metal layer 214 and not on the exposed surfaces of the insulating layer 208. Accordingly, in some embodiments, the blocking layer 216 is formed selectively on the top surface of the metal layer 214 and not on the trench or top portion 212 of the opening 211.

In one or more embodiments, the device 200 is exposed to a planar, non-polar organic molecule to selectively form a blocking layer 216 on the metal layer 214 over the insulating layer 208. In one or more embodiments, the device 200 is exposed to a planar hydrocarbon to selectively form a blocking layer 216 on the metal layer 214 over the insulating layer 208. As used in this manner, the phrase "the substrate is exposed to" means that the substrate as a whole, including the individual materials and layers thereon are exposed to the stated process or condition. In some embodiments, the planar hydrocarbon comprises one or more of anthracene, benzene, naphthalene, toluene, ethylbenzene, phenanthrene, mesitylene, and the like. In some embodiments, the planar hydrocarbon consists essentially of anthracene. In some embodiments, the planar hydrocarbon consists essentially of naphthalene. In some embodiments, the planar hydrocarbon consists essentially of toluene. As used in this manner, the term "consists essentially of" means that greater than or equal to about 95%, 98%, 99% or 99.5% of the planar hydrocarbon, on a molar basis, is the stated compound.

The blocking layer 216 is illustrated in the Figures as a series of parallel wavy lines; however, the skilled artisan will recognize that this merely used as a generic representation and does not imply any particular morphology, density, or structure of the blocking layer 216. The formation of the thin film of the blocking layer 216 may be considered a treatment process. Whereas the formation of thicker films is generally considered to be selective deposition.

Without intending to be bound by theory, it is believed that the d-orbitals of the metal layer 214 start to share electrons with the $sp^2$ orbitals of the planar hydrocarbon. Accordingly, in some embodiments, the planar hydrocarbon comprises at least one compound with at least one double bond between two carbon atoms. In some embodiments, the planar hydrocarbon comprises at least one compound with at least one triple bond between two carbon atoms.

Further, without being bound by theory, it is believed that the planar hydrocarbon (the blocking layer 216) suppresses one or more of the nucleation or growth rate of a subsequent film on the metal layer 214.

In some embodiments, the substrate is soaked in a vapor of the planar hydrocarbon. In some embodiments, the processing conditions for exposing the substrate to the planar hydrocarbon may be controlled.

In some embodiments, the pressure of the processing chamber is controlled. The pressure of the processing chamber may be any suitable pressure for forming the blocking layer 216. In some embodiments, the pressure of the processing chamber is maintained at less than or equal to about 80 Torr, less than or equal to about 70 Torr, less than or equal to about 60 Torr, less than or equal to about 50 Torr, less than or equal to about 40 Torr, less than or equal to about 30 Torr, less than or equal to about 20 Torr, less than or equal to about 15 Torr, less than or equal to about 10 Torr, or less than or equal to about 5 Torr. In some embodiments, the pressure of the processing chamber is maintained at about 10 Torr, about 20 Torr, about 30 Torr, about 40 Torr, or about 50 Torr.

In some embodiments, the flow rate of the planar hydrocarbon into the processing chamber is controlled. The flow rate of the planar hydrocarbon may be any suitable flow rate for forming the blocking layer 216. In some embodiments, the flow rate of the planar hydrocarbon is in a range of about 50 sccm to about 100 sccm, or in a range of about 75 sccm to about 100 sccm. In some embodiments, the flow rate of the planar hydrocarbon is less than or equal to about 600 sccm, less than or equal to about 500 sccm, less than or equal to about 400 sccm, less than or equal to about 300 sccm, less than or equal to about 250 sccm, less than or equal to about 200 sccm, less than or equal to about 150 sccm, less than or equal to about 100 sccm, less than or equal to about 75 sccm, or less than or equal to about 50 sccm. In some embodiments, the flow rate of the planar hydrocarbon is about 50 sccm or about 100 sccm.

In some embodiments, the soak period, during which the planar hydrocarbon is exposed to the substrate, is controlled. The soak period may be any suitable period for forming the blocking layer 216. In some embodiments, the soak period is greater than or equal to about 1 second, greater than or equal to about 10 seconds (s), greater than or equal to about 20 s, greater than or equal to about 30 s, greater than or equal to about 45 s, greater than or equal to about 60 s, greater than or equal to about 80 s, greater than or equal to about 120 s, greater than or equal to about 150 s, or greater than or equal to about 200 s. In some embodiments, the soak period is about 60 s. In some embodiments, the soak period is about 200 s.

In some embodiments, the temperature of the substrate is controlled during exposure to the planar hydrocarbon. The temperature of the substrate may also be referred to as the operating temperature. In some embodiments, the temperature of the substrate is less than or equal to about 300° C., less than or equal to about 275° C., less than or equal to about 250° C., less than or equal to about 225° C., or less than or equal to about 200° C.

In some embodiments, the compound of the planar hydrocarbon is a liquid at the operating temperature. In some embodiments, the compound of the planar hydrocarbon has a vapor pressure greater than or equal to about 0.1 Torr at the operating temperature.

Figure 2D:
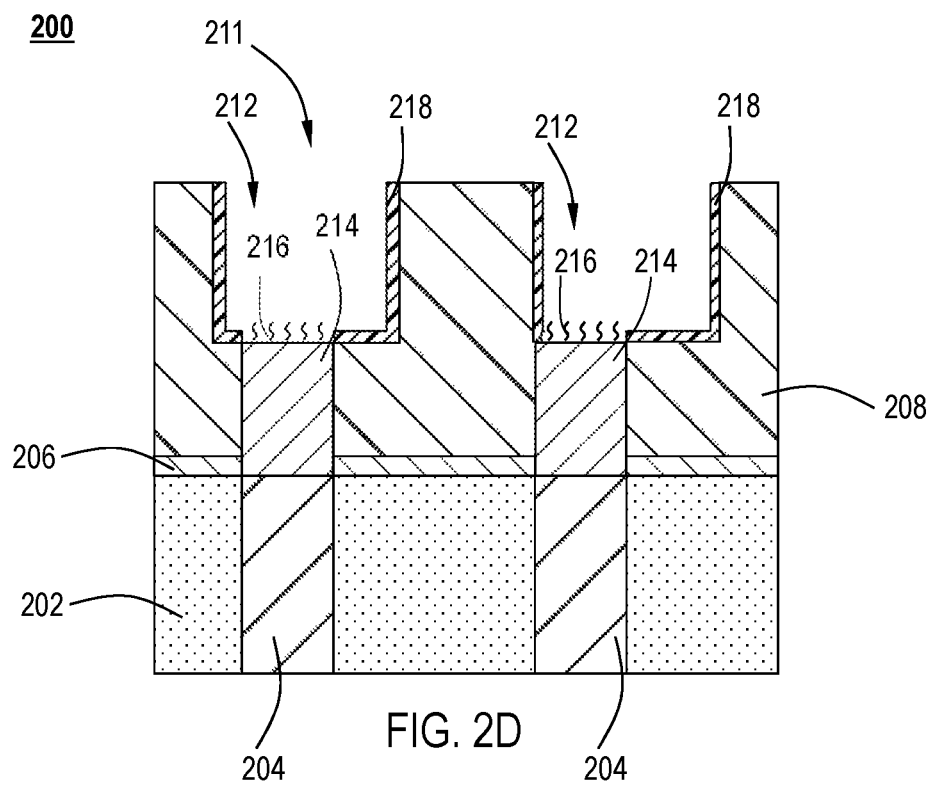

Referring to FIG. 1 and FIG. 2D, in some embodiments, the method 100 continues at operation 110 with the deposition of a conformal barrier layer 218 on the insulating layer 208 over the blocked metal layer 214. The barrier layer 218 may be deposited by any technique known to the skilled artisan. The deposition of the barrier layer 218 on the insulating layer 208 may be referred to as "reverse selective deposition" or "reversely selective deposition." The skilled artisan will understand that the term "selective deposition" is typically applied to the formation of a film on a metal surface, not a non-metallic surface. A reversely selective deposition process forms the film or barrier layer 218 on the non-metallic surface, the insulating layer 208.

In one or more embodiments, the barrier layer 218 is deposited by atomic layer deposition. In some embodiments, the barrier layer 218 is deposited by sequentially exposing the substrate 202 to a metal precursor and a reactant. In some embodiments, the barrier layer 218 comprises a metal nitride. In some embodiments, the barrier layer 218 functions as a barrier film. In some embodiments, the barrier layer 218 comprises or consists essentially of titanium nitride (TiN). In some embodiments, the barrier layer 218 comprises or consists essentially of tantalum nitride (TaN). In some embodiments, the metal precursor comprises pentakis(dimethylamino)tantalum. In some embodiments, the reactant comprises ammonia. In some embodiments, the barrier layer 218 is formed without the use of plasma.

With reference to FIG. 1, in some embodiments, at operation 112, the method 100 continues by removing the blocking layer 216 from the metal layer 214. The blocking layer 216 may be removed by any suitable means, including but not limited to, a plasma cleaning processes. In some embodiments, the substrate 202 is exposed to a plasma to remove the blocking layer 216 from the metal layer 214. In some embodiments, the plasma comprises or consists essentially of one or more of argon (Ar), nitrogen ($N_2$) or hydrogen ($H_2$). As used in this specification, a plasma comprising nitrogen, hydrogen, oxygen, or the like, means a plasma formed from the molecular form of the species named. For example, a nitrogen plasma refers to a plasma ignited from molecular nitrogen ($N_2$). As used in this specification and the appended claims, an element-containing plasma (e.g., a nitrogen-containing plasma) refers to a compound that includes the element. For example, a nitrogen-containing plasma comprises or consists essentially of one or more compounds having nitrogen as an element (e.g., ammonia ($NH_3$)). In some embodiments, the plasma consists essentially of argon. In some embodiments, the plasma comprises or consists essentially of a mixture of $H_2$ and Ar.

In some embodiments, the apparatus or process tool is configured to maintain the substrate under vacuum conditions to prevent formation of an oxide layer after the removal of the blocking layer. In embodiments of this sort, the process tool is configured to move the substrate from a plasma cleaning chamber to a deposition process chamber without exposing the substrate to atmospheric conditions.

In one or more embodiments, the mixture of $H_2$ and Ar has a ratio of $H_2$:Ar in a range of about 10:1 to about 1:10, in a range of about 10:1 to about 1:1, in a range of about 1:1 to about 1:10, in a range of about 5:1 to about 1:5, in a range of about 5:1 to about 1:1, in a range of about 1:1 to about 1:5, in a range of about 2:1 to about 1:2, in a range of about 2:1 to about 1:1, or in a range of about 1:1 to about 1:2. In some embodiments, the mixture of $H_2$/Ar is about 1:1.

In one or more embodiments, the power of the plasma may be varied depending on the composition, packing and/or thickness of the blocking layer and composition and/or thickness of the surrounding materials. In some embodiments, the plasma power is in a range of about 20 W to about 500 W, in a range of about 20 W to about 400 W, in a range of about 20 W to about 250 W, in a range of about 50 W to about 500 W, in a range of about 100 W to about 500 W, in a range of about 100 W to about 450 W, in a range of about 100 W to about 500 W, or in a range of about 200 W to about 400 W. In some embodiments, the plasma power is about 50 W, about 200 W or about 400 W.

In one or more embodiments, the duration of the plasma exposure may be varied depending on the composition, packing and/or thickness of the blocking layer 216 and composition and/or thickness of the surrounding materials. In some embodiments, the substrate is exposed to the plasma for a period in a range of from about 2 seconds (s) to about 60 seconds (s), in a range of from about 3 s to about 30 s, or in a range of from about 5 s to about 10 s. In some embodiments, the substrate is exposed to the plasma for a period of about 3 s, about 5 s, about 10 s or about 30 s.

Figure 2E:
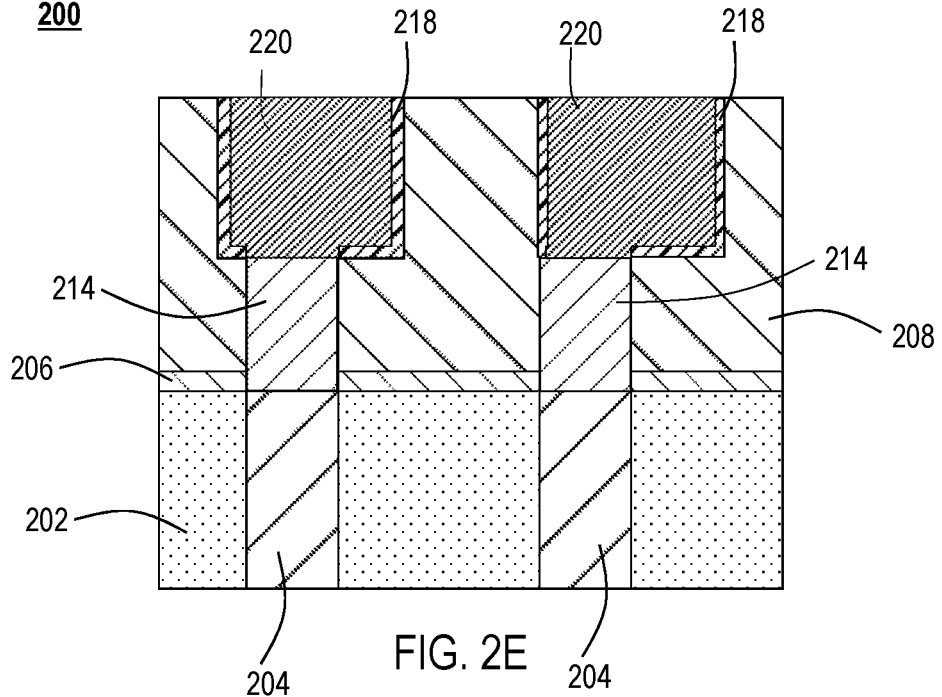
Figure 2F:
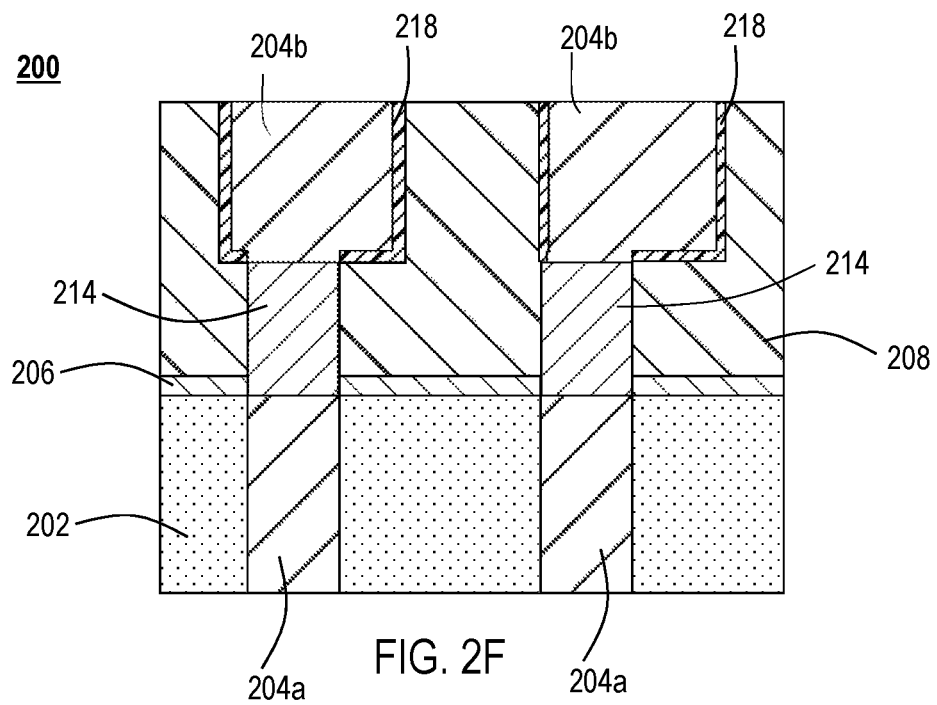

In embodiments like that illustrated in FIG. 2E and FIG. 2F, in which the conductive via fill material 214 is grown in a bottom-up manner to fill the via portion 210 that makes up the lower portion of the feature 211, a second conductive material 220 is deposited in the upper portion 212. For example, in operation 114 illustrated in FIG. 2E, the upper portion 212 of the feature 211 is filled with a conductive material 220 to form the $M_{x+1}$ conductive line.

With reference to FIG. 1 and FIGS. 2E and 2F, at operation 114, after the blocking layer 216 is removed from the top surface of the metal layer 214, a second metallization layer 220 or second metal line is formed or deposited. In one or more embodiments, the second metallization layer 220 may comprise any suitable metal known to the skilled artisan. In some embodiments, the second metallization layer 220 is selected from one or more of copper (Cu), cobalt (Co), ruthenium (Ru), iridium (Ir), rhodium (Rh), molybdenum (Mo), tungsten (W), aluminum (Al), nickel (Ni), and platinum (Pt). In some embodiments, the second metallization layer 220 consists essentially of copper (Cu), cobalt (Co), ruthenium (Ru), iridium (Ir), rhodium (Rh), molybdenum (Mo), tungsten (W), aluminum (Al), nickel (Ni), or platinum (Pt). In some embodiments, the second metallization layer 220 consists essentially of copper, cobalt, ruthenium, tungsten, or molybdenum. In some embodiments, the second metallization layer 220 comprises or consists essentially of copper. As used in this specification and the appended claims, the term "consists essentially of" means that the material is greater than or equal to about 95%, 98% or 99% of the stated material on an atomic basis. With reference to FIG. 2F, in one or more embodiments, the first metallization layer 204a and the second metallization layer 204b comprise the same metal material.

FIGS. 3A thru 3F illustrate another embodiment of the disclosure similar to both those shown in FIGS. 1 thru 2F. The method occurs with the same materials and overall process as previously described. The embodiment illustrated in FIGS. 3A thru 3F is representative of a method for the formation of a via connecting the $M_x$ and $M_{x+1}$ metal lines, as will be recognized by the skilled artisan.

Referring to FIGS. 3A thru 3E, an exemplary reversely selective deposition method using begins by providing a substrate 200 having an insulating layer 208 with at least one feature 211 formed therein. The different films and layers described are analogous to those of FIGS. 2A thru 2E and the skilled artisan will recognize that these are merely different structural forms of similar methods. The at least one feature 211 has a bottom portion or via portion 210 and a top portion or trench portion 212. In the illustrated embodiment, the sidewalls comprise, and are formed by, insulating layer 208. The bottom surface of the via opening 210 comprises and is formed by a first metallization layer 204 or first metallization line. The at least one feature 211 may have one sidewall (e.g., a circular via), two sidewalls (e.g., a trench) or more sidewalls (e.g., square or polygonal via).

Figure 3A:
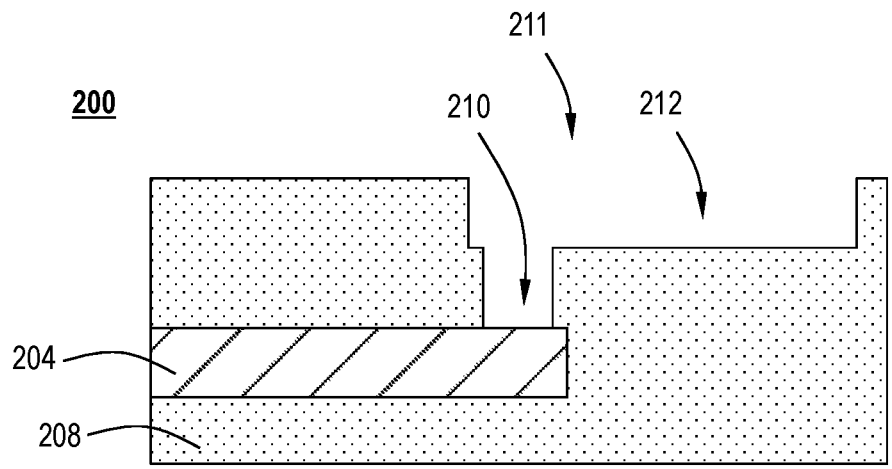
FIGS. 3A-3E illustrates a cross-sectional view of an exemplary substrate during processing according to one or more embodiments of the disclosure.
Figure 3B:
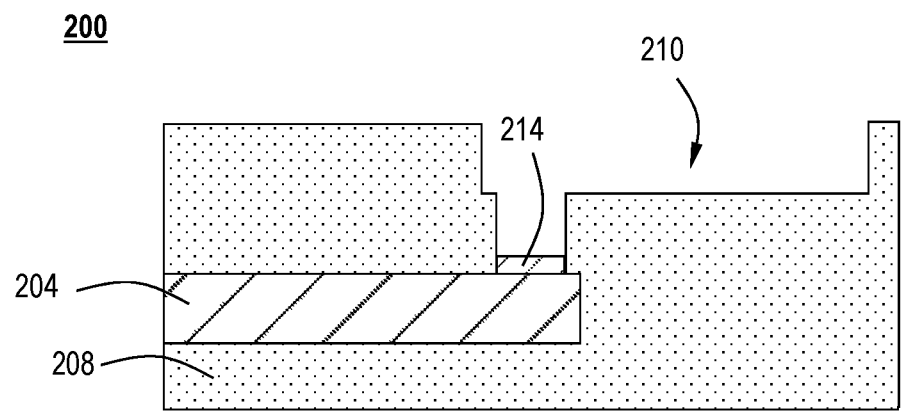

With reference to FIG. 3B, a metal layer 214 is formed or deposited in the bottom portion 210 of the at least one feature 211. The metal layer 214 has a height. In some embodiments, the height of the metal layer 214 is less than the depth of the bottom portion 210 or via opening. In one or more embodiments, the metal layer 214 has a height in a range of from about 25% to about 90% of the depth of the bottom portion or via portion 210

Figure 3C:
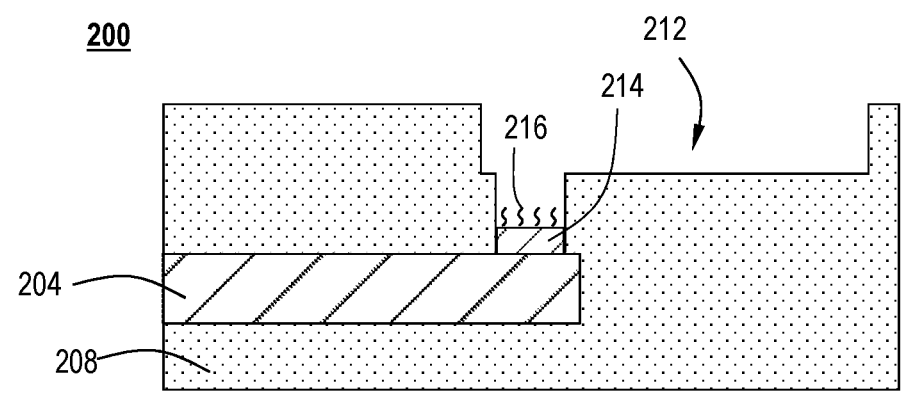

Referring to FIG. 3C, the substrate 200 is exposed to a planar hydrocarbon to selectively form a blocking layer 216 on the top surface of the metal layer 214 forming the bottom of the feature 211 over the top portion of the insulating layer 208. Stated differently, the substrate 200 is treated with a planar hydrocarbon to deactivate or block future deposition on the metal layer 214.

Figure 3D:
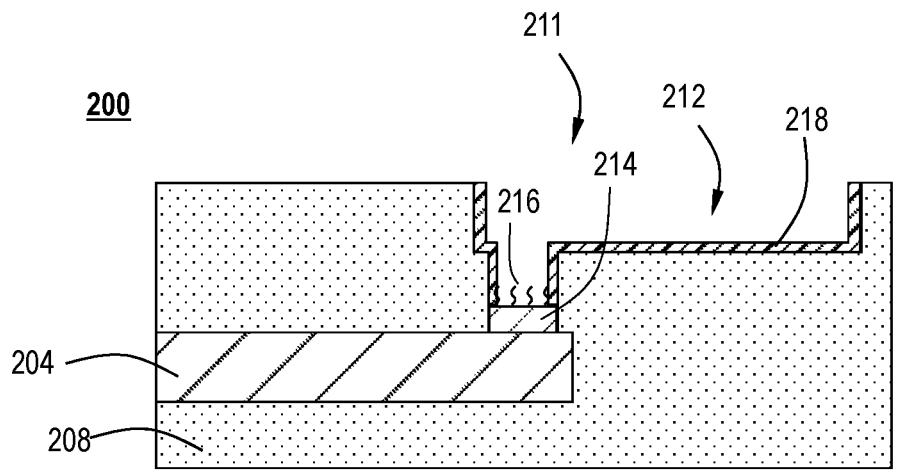

With reference to FIG. 3D, reversely selective deposition of barrier layer 218 on the insulating layer 208 over the blocking layer 216. Again, the skilled artisan will understand that the term "reversely selective deposition" refers to a selective deposition process in which a film is formed on the insulating layer 208. In some embodiments, the barrier layer 218 is deposited by sequentially exposing the substrate 200 to a metal precursor and a reactant. In some embodiments, the barrier layer 218 comprises a material that acts as a barrier layer. In some embodiments, depending upon the thickness of the metal layer 214, the barrier layer 218 may form in both the top portion 212 or trench portion and in the bottom portion 210 or via opening of the at least one opening 211. In other embodiments, the conformal barrier layer 218 does not form in the bottom portion 210 of the at least one opening.

In one or more embodiments, optionally, the blocking layer 216 is removed from the surface of the metal layer 214 on the bottom of the feature 211. Without intending to be bound by theory, it is believed that the blocking layer 216 increases the resistance of the conductive fill material 220 only marginally when compared to the increase in resistance typically seen with most barrier layers (e.g., barrier layer 218). Accordingly, the removal of the blocking layer 216 is an optional process which may further decrease the resistance of the conductive fill material 220.

Regardless of whether the blocking layer 216 is removed at operation 112, a conductive fill material 220 (or the second metallization layer or line) is deposited within the at least one feature 211 to form a low-resistance metal via. In some embodiments, the low-resistance metal via has a resistance less than or equal to about 80% of a metal via formed without the blocking layer. Stated differently, the low-resistance metal vias formed by the disclosed process including the blocking layer 216 provide a via resistance reduction of greater than or equal to about 20%.

Figure 3E:
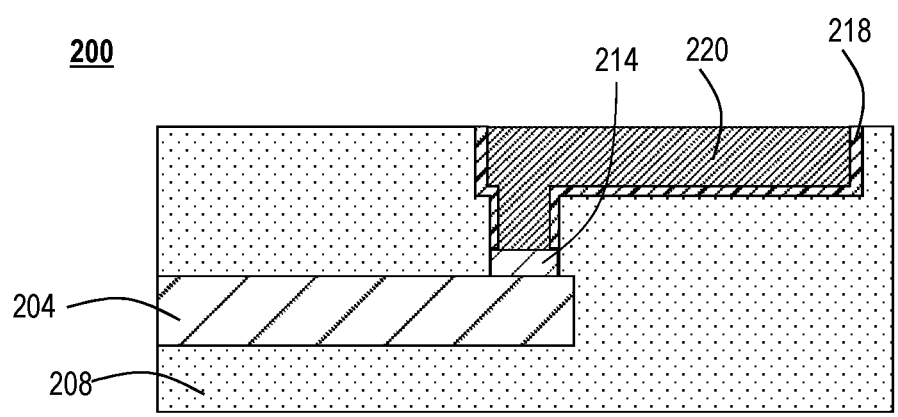

In embodiments like that illustrated in FIG. 3E, in which the conductive via fill material 214 is grown in a bottom-up manner to fill the via portion 210 that makes up the lower portion of the feature 211, a second conductive material 220 is deposited in the upper portion 212. For example, as illustrated in FIG. 3E, the upper portion 212 of the feature 211 is filled with a conductive material 220 to form the $M_{x+1}$ conductive line.

In some embodiments, the second metallization layer 220 is deposited to overfill the feature 211 and form an overburden on the surface of the substrate 200. The overburden is then removed by any suitable technique (e.g., etching, chemical-mechanical planarization (CMP)).

FIG. 4 and FIGS. 5A thru 5F illustrates another embodiment of the disclosure similar to both those shown in FIGS. 1 thru 3E. The method 120 begins at operation 122, where a substrate is optionally pre-cleaned.

Figure 4:
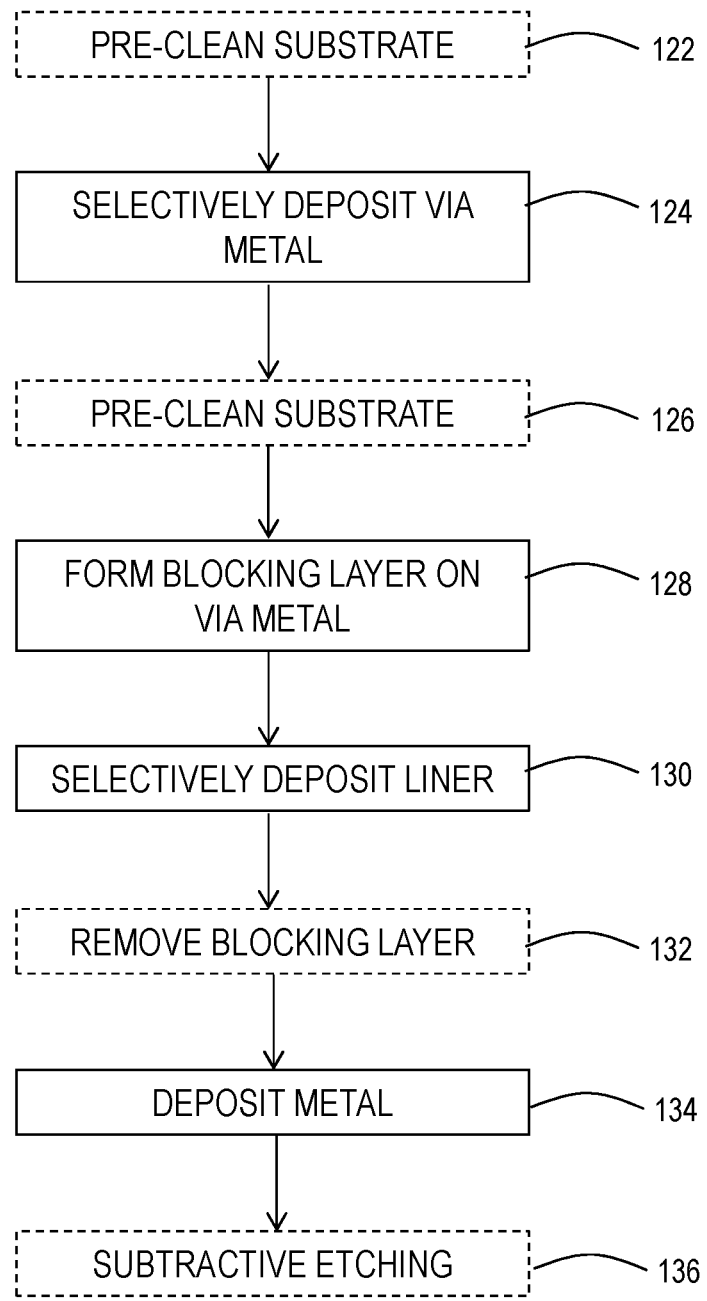
FIG. 4 illustrates a process flow diagram of a method according to one or more embodiments of the disclosure.
Figure 5A:
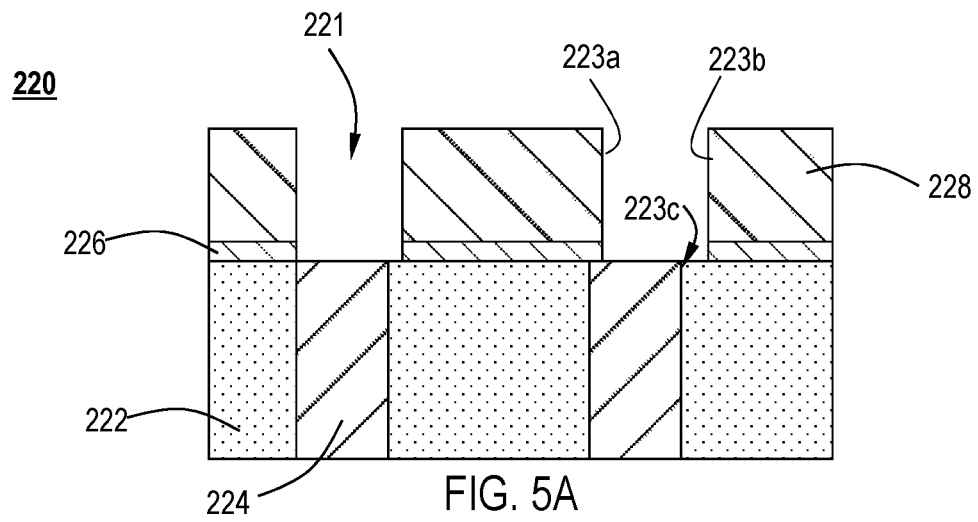
FIGS. 5A-5F illustrate cross-sectional views of an exemplary substrate during processing according to one or more embodiments of the disclosure.

With reference to FIG. 4 an FIG. 5A, a substrate 222 having an insulating layer 228 and a conductive material 224 or first metallization layer thereon. A feature 221 is formed in the insulating layer 222. The feature 221 has sidewalls 223a, 223b and a bottom 223c. The sidewalls 223a, 223b are formed by the insulating layer 222. In some embodiments, an etch stop layer 226 is disposed on a top surface of the substrate 222 and the first metallization layer 224. The bottom 223c of the at least one feature 221 is formed by the top surface of the conductive material 224 (or first metallization layer). In some embodiments, the conductive material 224 of the first metallization line, is also referred to as the $M_x$ line.

Figure 5B:
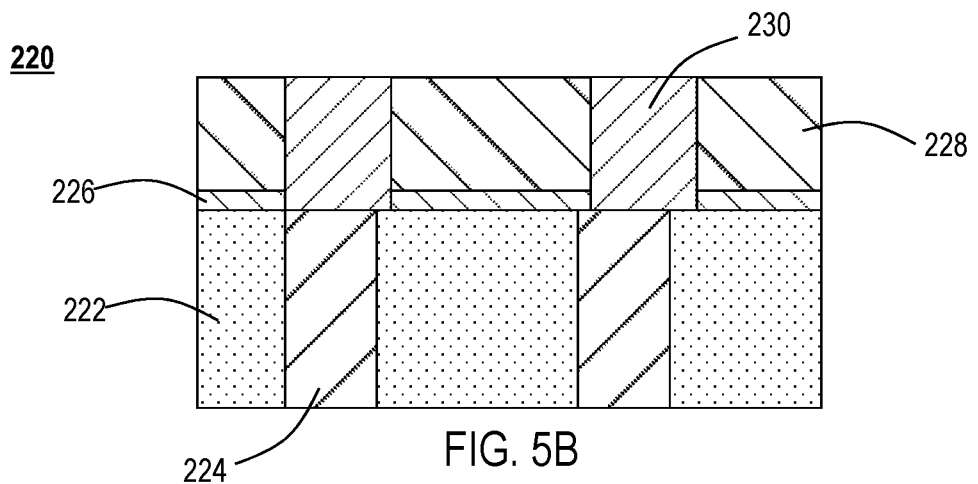

With reference to FIG. 4 and FIG. 5B, at operation 124, a via metal 230 is formed or deposited in the at least one opening 221 and contacts the first metallization layer 224. At operation 126, the substrate may be optionally pre-cleaned. For example, in some embodiments, the via metal 230 may be cleaned to remove native oxide that may have formed.

Figure 5C:
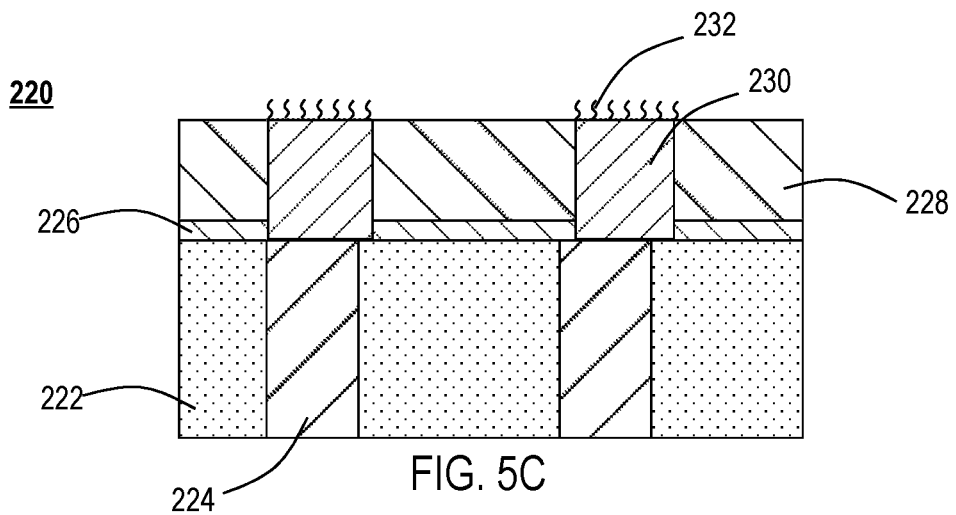

As illustrated in FIG. 5C, at operation 128, the substrate is exposed to a planar hydrocarbon to selectively form a blocking layer 232 on the top surface of the via metal 230 over the top surface of the insulating layer 228.

Figure 5D:
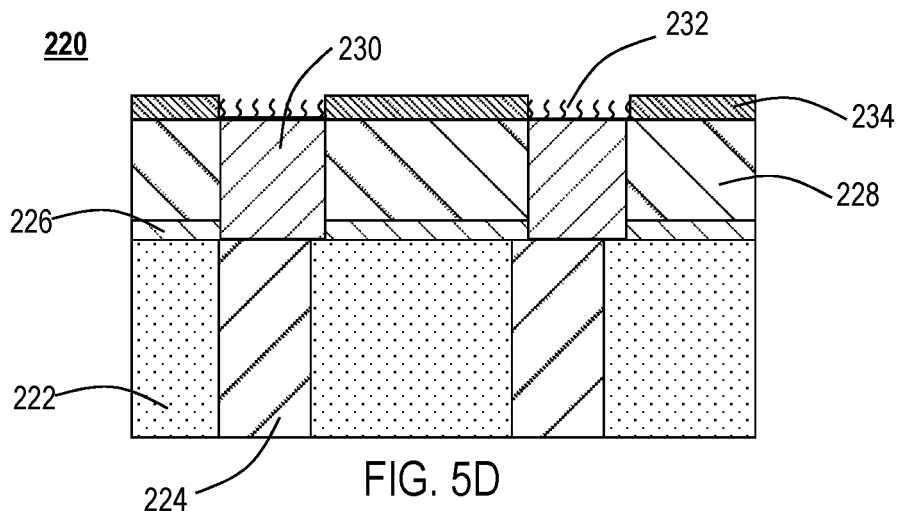

Referring to FIG. 4 and FIG. 5D, at operation 132 a barrier layer 234 is selectively deposited on the insulating layer 228 over the blocking layer 232. As illustrated in FIG. 5D, the barrier layer 234 is deposited selectively on the top surface of the insulating layer 228. The barrier layer 234 is deposited on the exposed insulating layer 228 surfaces and not on the via metal 230. The barrier layer 234 can be deposited by any suitable technique known to the skilled artisan. In some embodiments, the barrier layer 234 is deposited by sequentially exposing the substrate to a metal precursor and a reactant.

Figure 5E:
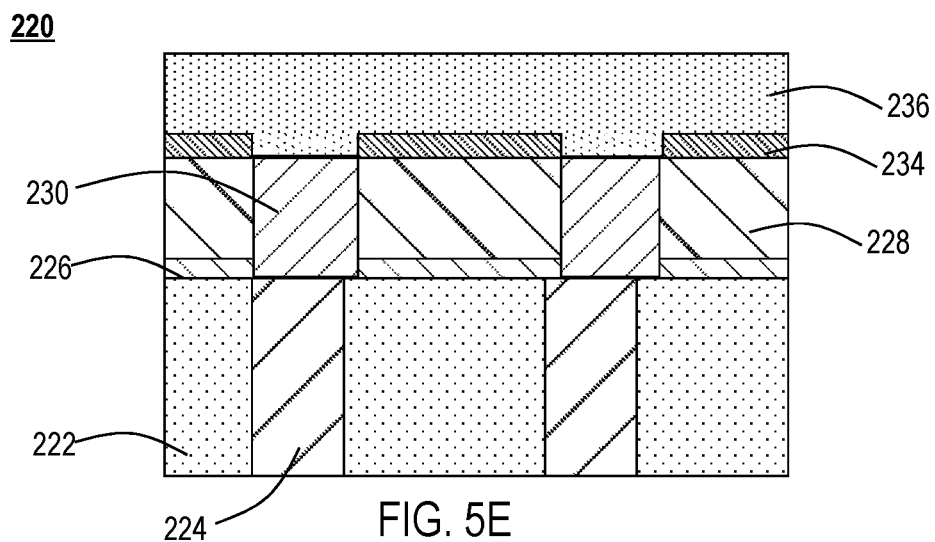
Figure 5F:
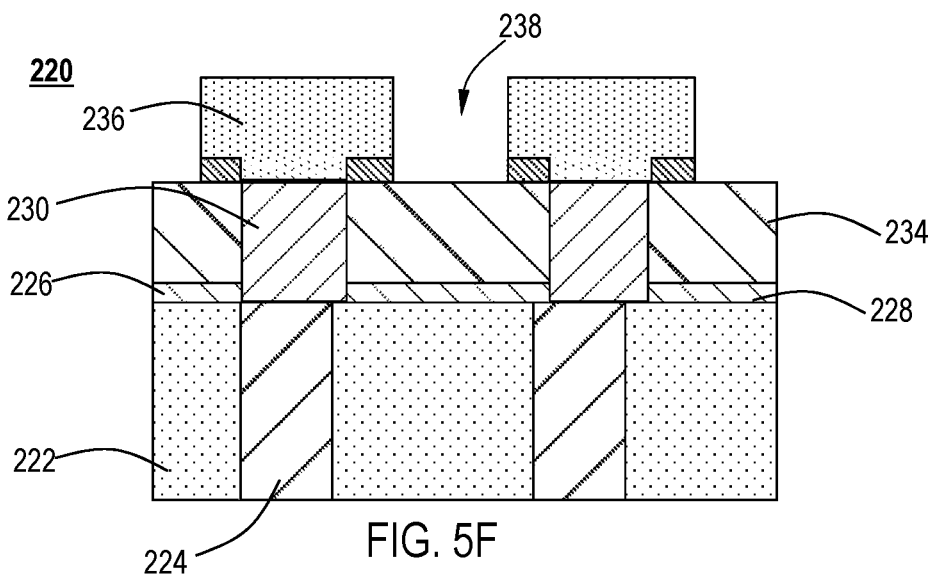

The method 120, at optional operation 132, includes optionally removing the blocking layer 232 from the surface of the via metal 230. With reference to FIG. 4 and FIG. 5E, regardless of whether the blocking layer 232 is removed at operation 132, the method 120 continues at operation 134 with a selective deposition of a second metallization layer 236. A conductive via fill material 236 is deposited selectively on the barrier layer 234.

The second metallization layer 236 can be any suitable material known to the skilled artisan. In the illustrated embodiment, the first metallization layer 224, the via metal 230, and the second metallization 236 are different materials. In other embodiments, the first metallization layer 224 and the second metallization layer 236 may be the same material. For example, in some embodiments, the first metallization layer 224 and the second metallization layer 236 comprise copper and the via metal 230 comprises cobalt.

The second metallization layer 236 can be deposited by any suitable technique known to the skilled artisan. In some embodiments, the second metallization layer 236 is deposited by one or more of a chemical vapor deposition (CVD) process, an atomic layer deposition (ALD) process or a physical vapor deposition (PVD) process.

Referring to FIG. 5E, the substrate 220 is etched (i.e., subtractive etch) to form an opening 238 (or trench) in the second metallization layer 236.

FIG. 6 and FIGS. 7A thru 7E illustrate another embodiment of the disclosure similar to those shown in FIGS. 1 thru 5E. The method occurs with the same materials and overall process as previously described. The embodiment illustrated in FIGS. 7A thru 7E is representative of a method for the formation of a via connecting the $M_x$ and $M_{x+1}$ metal lines, as will be recognized by the skilled artisan. The method illustrated in FIGS. 7A thru 7E may be an integrated process performed in a processing tool without breaking vacuum.

Referring to FIG. 6 and FIGS. 7A thru 7E, an exemplary reversely selective deposition method 140 begins by providing a substrate 250 having an insulating layer 252, first metallization layer 254, and a first feature thereon (not illustrated). At operation 142, the substrate is optionally pre-cleaned. At operation 144, a via/contact 256 is selectively deposited or formed on the top surface of the first metallization layer 254 in a bottom portion of the first feature. The different films and layers described are analogous to those of FIGS. 2A thru 2E and the skilled artisan will recognize that these are merely different structural forms of similar methods.

Figure 6:
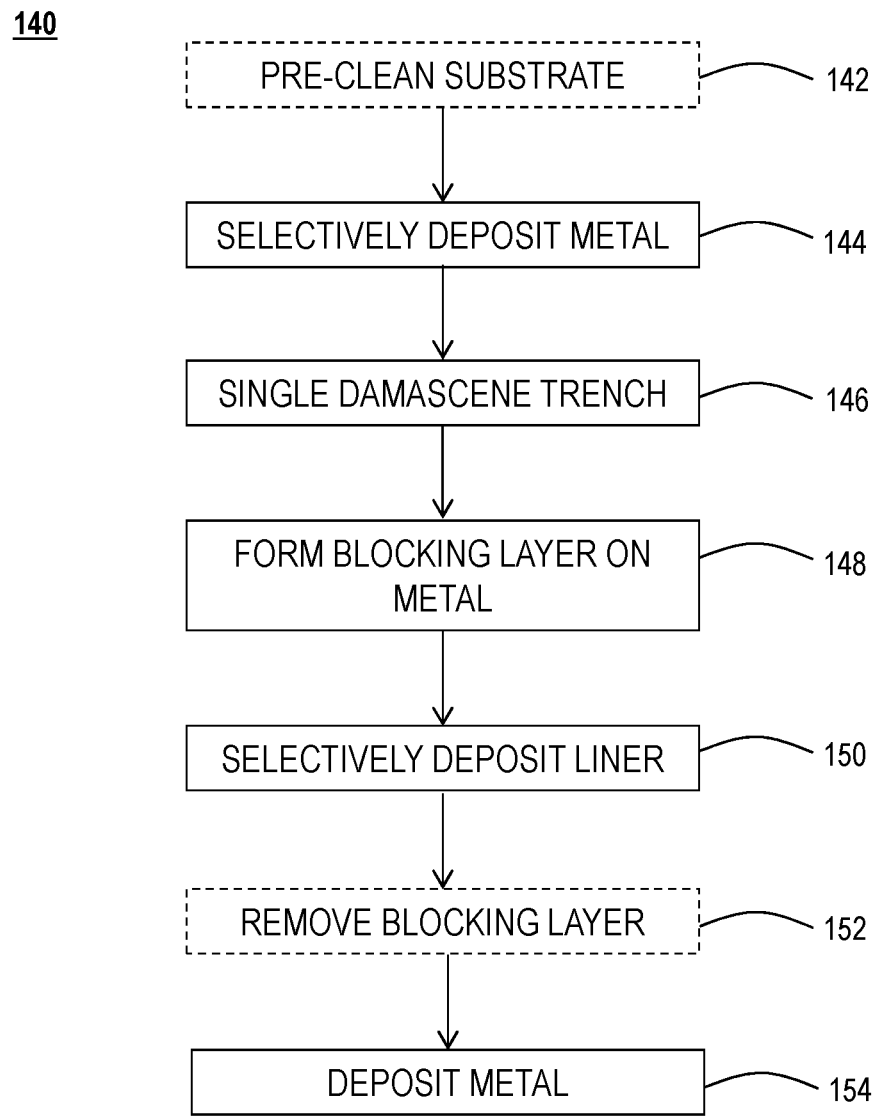
FIG. 6 illustrates a process flow diagram of a method according to one or more embodiments of the disclosure.
Figure 7A:
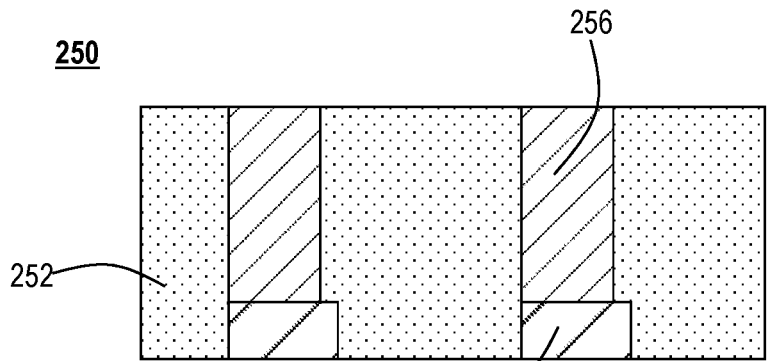
FIGS. 7A-7E illustrate cross-sectional views of an exemplary substrate during processing according to one or more embodiments of the disclosure.
Figure 7B:
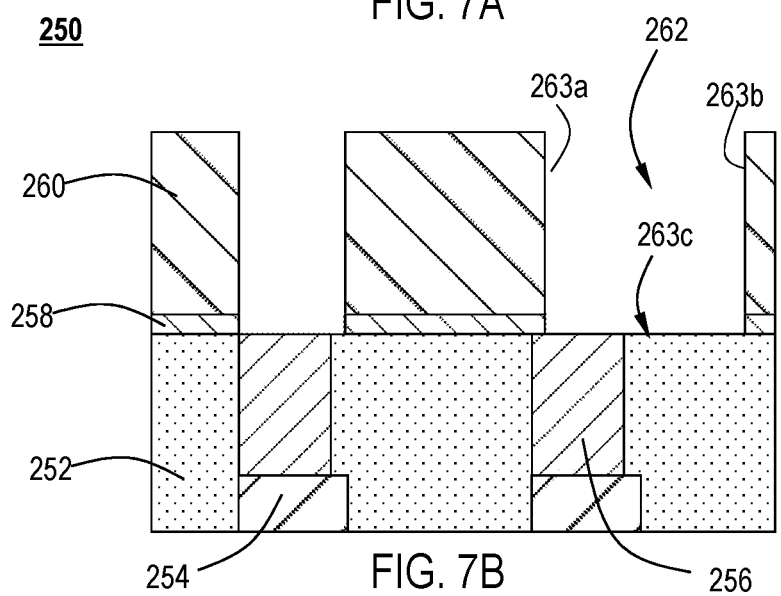

An etch stop layer 258 is deposited on a top surface of the insulating layer 252 and the via/contact 256. The etch stop layer 258 may comprise any suitable material known to the skilled artisan. In one or more embodiments, the etch stop layer 258 comprises one or more of aluminum oxide (AlO), silicon carbonitride (SiCN), and silicon nitride (SiN). A second insulating layer 260 is deposited on the etch stop layer 258. Referring to FIG. 6 and FIG. 7B, a single damascene process is conducted to form a trench 262 in insulating layer 260. The single damascene process opens the etch stop layer 258, exposing a top surface of the via/contact 256, such that the top surface of the via/contact 256 becomes a bottom surface of the trench 262. In some embodiments, the single damascene process to open the etch stop layer 258 includes a plasma/radical based etch followed by a pre-cleaning. The pre-cleaning operation can be any suitable pre-cleaning process known to the skill artisan. Suitable pre-cleaning operations include, but are not limited to, soaking, native oxide remove, and the like. In one or more embodiments, the single damascene process occurs in an integrated system without vacuum breaking. The damascene trench 262 has sidewalls 263a, 263b, and a bottom 263c. In the illustrated embodiment, the sidewalls comprise, and are formed by, insulating layer 260. The bottom surface of the damascene trench 262 comprises and is formed by via/contact 256 and a portion of insulating layer 252. The damascene trench 262 may have one sidewall (e.g., a circular via), two sidewalls (e.g., a trench) or more sidewalls (e.g., square, or polygonal via).

Figure 7C:
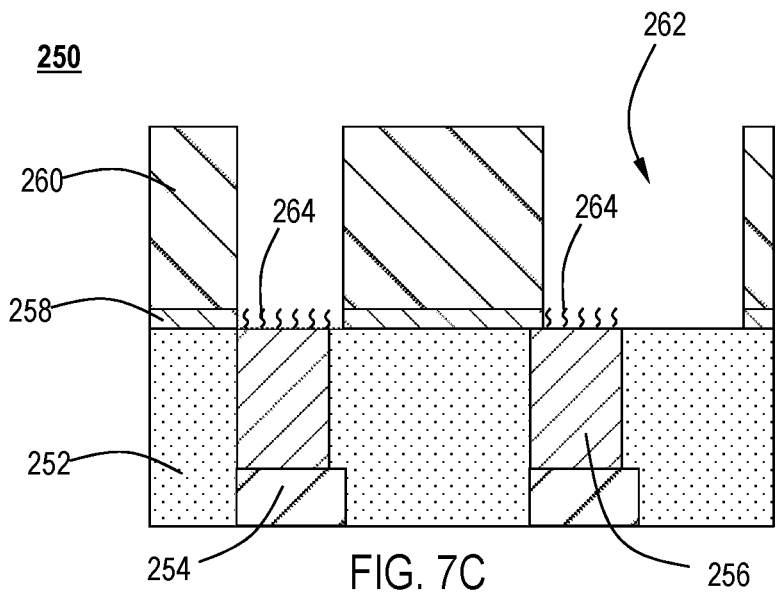

Referring to FIG. 7C, the substrate 250 is exposed to a planar hydrocarbon to selectively form a blocking layer 264 on the top surface of the via/contact 256 over the insulating layer 260. Stated differently, the substrate 250 is treated with a planar hydrocarbon to deactivate or block future deposition on the via/contact 256.

Figure 7D:
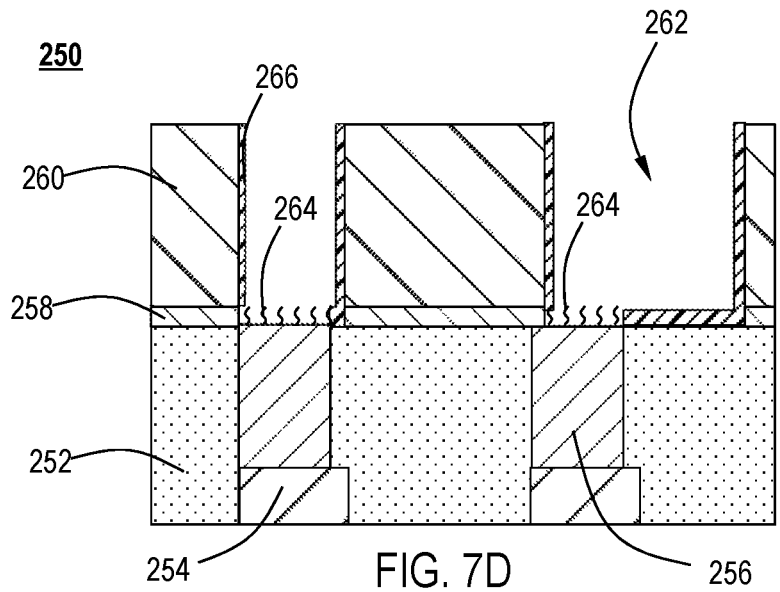
Figure 7E:
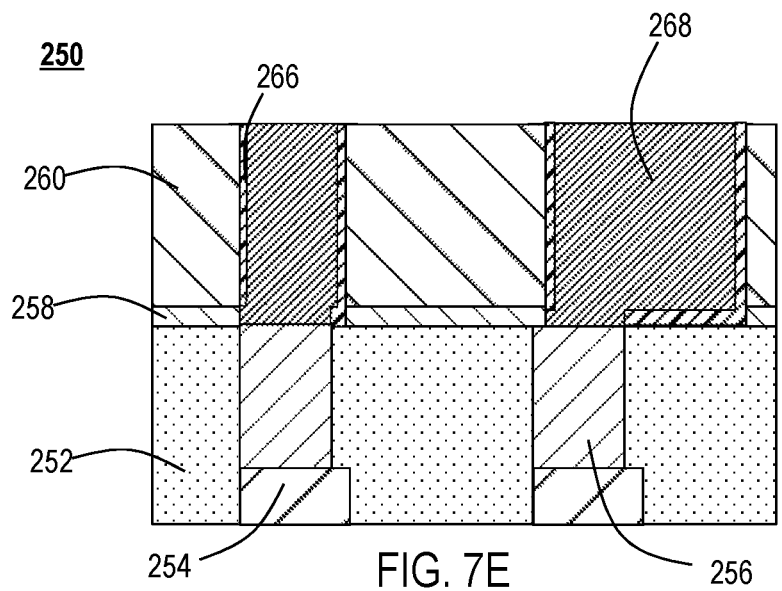

With reference to FIG. 7D, reversely selective deposition of barrier layer 266 on the insulating layer 260 over the blocking layer 264. Again, the skilled artisan will understand that the term "reversely selective deposition" refers to a selective deposition process in which a film is formed on the insulating layer 264 and not on the via/contact 256. In some embodiments, the barrier layer 266 is deposited by sequentially exposing the substrate 250 to a metal precursor and a reactant. In some embodiments, the barrier layer 266 comprises a material that acts as a barrier layer.

In one or more embodiments, optionally, the blocking layer 264 is removed from the surface of the via/contact 256. Without intending to be bound by theory, it is believed that the blocking layer 264 increases the resistance of the conductive fill material 268 only marginally when compared to the increase in resistance typically seen with most barrier layers (e.g., barrier layer 266). Accordingly, the removal of the blocking layer 264 is an optional process which may further decrease the resistance of the conductive fill material 268.

Regardless of whether the blocking layer 266 is removed at operation 152, a conductive fill material 268 (or the second metallization layer or line) is deposited within the at least one feature 262 to form a low-resistance metal via. In some embodiments, the low-resistance metal via has a resistance less than or equal to about 80% of a metal via formed without the blocking layer. Stated differently, the low-resistance metal vias formed by the disclosed process including the blocking layer 264 provide a via resistance reduction of greater than or equal to about 20%.

In some embodiments, the second metallization layer 268 is deposited to overfill the feature 262 and form an overburden on the surface of the substrate 250. The overburden is then removed by any suitable technique (e.g., etching, chemical-mechanical planarization (CMP)).

Figure 8:
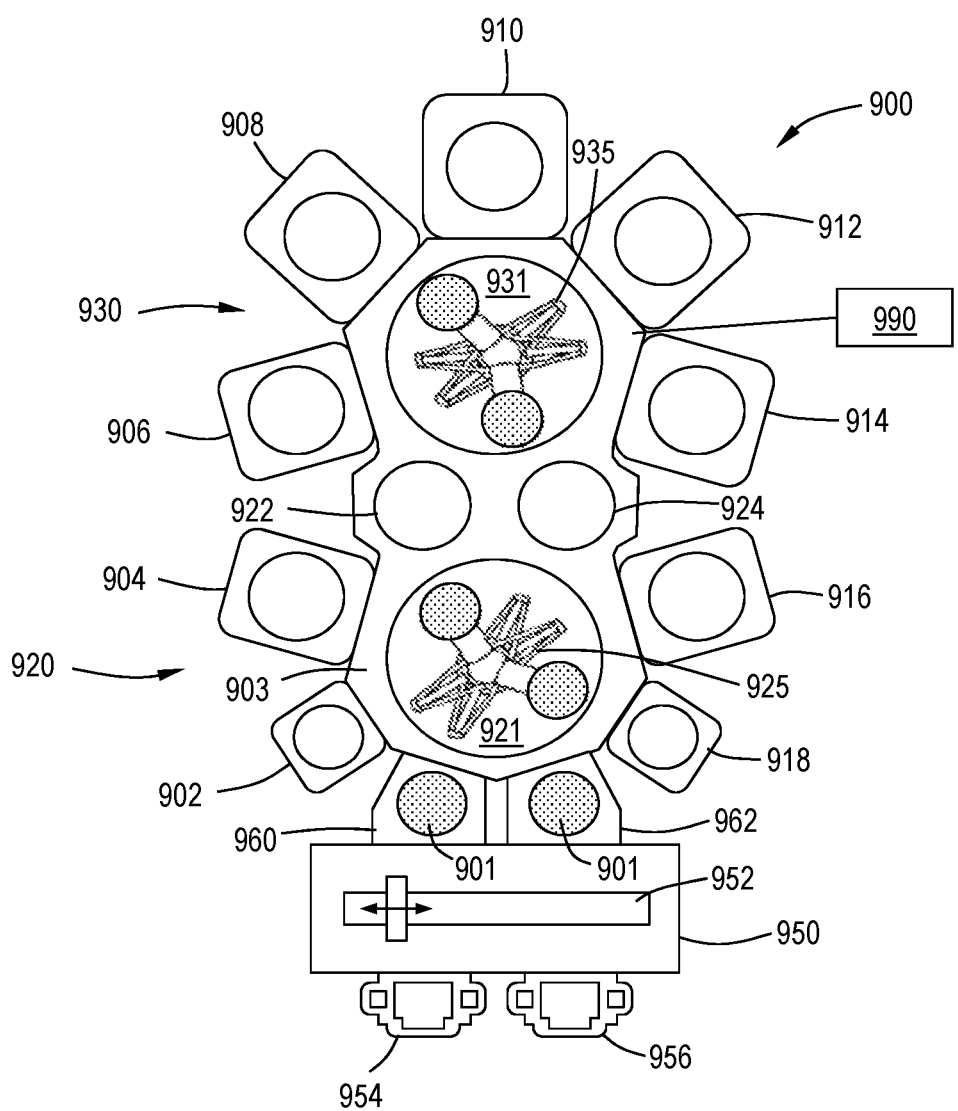
FIG. 8. illustrates an exemplary cluster tool according to one or more embodiments of the disclosure.

Additional embodiments of the disclosure are directed to processing tools 900 for the formation of the devices and methods described, as shown in FIG. 8. A variety of multi-processing platforms, including the Centura®, Dual ACP, Producer® GT, and Endura® platform, available from Applied Materials® as well as other processing systems may be utilized. In one or more embodiments, the cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a selective metal deposition chamber; a barrier metal deposition chamber; a metal deposition chamber; a PVD metal deposition chamber; a CVD metal deposition chamber; a blocking layer deposition chamber; a liner metal deposition chamber; a plasma chamber; a pre-clean chamber; an etching chamber; transfer space(s), a wafer orienter/degas chamber, a cryo cooling chamber, and the like. The particular arrangement of process chambers and components can be varied depending on the cluster tool and should not be taken as limiting the scope of the disclosure.

In one or more embodiments, the cluster tool 900 includes a blocking layer deposition chamber to expose the substrate to a planar hydrocarbon and form a blocking layer. In one or more embodiments, the cluster tool 900 includes a pre-cleaning chamber connected to the central transfer station.

In the embodiment shown in FIG. 8, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In one or more embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930 or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits, and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In one or more embodiments, the processing tool 900 comprises a central transfer station 921, 931 comprising at least one robot 925, 935 configured to move a wafer; one or more of a selective via fill station, a reversely selective deposition station, a blocking layer formation station, a CVD station, a PVD station connected to the central transfer station; an optional pre-clean station connected to the central transfer station; and at least one controller connected to the one or more of the central transfer station, selective via fill station, a reversely selective deposition station, a blocking layer formation station, a CVD station, a PVD station or the optional pre-clean station. In one or more embodiments, the at least one controller has at least one configuration selected from: a configuration to move the wafer between stations using the robot; a configuration to selectively fill a via; a configuration to expose a substrate to a planar hydrocarbon and form a blocking layer; a configuration for reversely selective deposition of a barrier layer; a configuration to deposit a metal; and a configuration to pre-clean the wafer.

In one or more embodiments, a processing tool comprises: a pre-clean chamber having a substrate support therein; a selective metal deposition chamber; a barrier metal deposition chamber; a metal deposition chamber; a PVD metal deposition chamber; a CVD metal deposition chamber; optionally, a blocking layer deposition chamber with an optional pre-clean; optionally, a liner metal deposition chamber; optionally, a plasma chamber; optionally, an etching chamber; a robot configured to access the pre-clean chamber, the selective deposition chamber, the optional blocking layer deposition chamber, the barrier metal deposition chamber, the PVD metal deposition chamber, the optional plasma chamber; and the optional etching chamber, the optional liner metal deposition chamber, the CVD metal deposition chamber and the PVD metal deposition chamber; and a controller connected to the pre-clean chamber, the selective deposition chamber, the optional blocking layer deposition chamber, the barrier metal deposition chamber, the PVD metal deposition chamber, the optional plasma chamber; and the optional etching chamber, the optional liner metal deposition chamber, the CVD metal deposition chamber and the PVD metal deposition chamber, and the robot, the controller having one or more configurations selected from: cleaning a substrate, selectively forming a blocking layer, selectively depositing a liner, optionally forming a metal liner, forming a metallization layer, optional etching the substrate, and, optionally removing the blocking layer.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within.

What is claimed is:

1. A method of forming an electronic device, the method comprising:
   pre-cleaning the electronic device;
   selectively depositing a metal layer on a bottom portion of an opening in an insulating layer on a first metallization layer, the opening comprising a trench and a via, the insulating layer comprising the opening extending from a top surface of the insulating layer to the first metallization layer, the opening having at least one sidewall, a top portion, and the bottom portion that is the via, the bottom portion not comprising a bottom barrier layer, the metal layer extending to the first metallization layer, wherein the metal layer does not form in the top portion of the opening;
   selectively depositing a barrier layer on the at least one sidewall of the top portion of the opening and not on the metal layer and not on the bottom portion that is the via of the opening; and
   forming a second metallization layer in the top portion of the opening on the metal layer and on the barrier layer, the method being performed in a cluster tool without breaking vacuum.

2. The method of claim 1, wherein the selectively depositing the barrier layer comprises forming a blocking layer on the metal layer and not the insulating layer.

3. The method of claim 2, wherein the forming the blocking layer comprises exposing the metal layer to a planar hydrocarbon.

4. The method of claim 3, wherein the planar hydrocarbon comprises one or more of anthracene, benzene, naphthalene, toluene, ethylbenzene, phenanthrene, and mesitylene.

5. The method of claim 2, further comprising exposing the electronic device to a plasma to remove the blocking layer.

6. The method of claim 1, wherein the first metallization layer, the second metallization layer, and the metal layer independently comprise a metal selected from one or more of copper (Cu), cobalt (Co), ruthenium (Ru), iridium (Ir), rhodium (Rh), molybdenum (Mo), tungsten (W), aluminum (Al), nickel (Ni), and platinum (Pt).

7. The method of claim 6, wherein the first metallization layer and the second metallization layer comprise the same metal.

8. The method of claim 1, wherein the insulating layer comprises one or more of silicon dioxide, silicon oxide, carbon doped oxide, silicon carbide, silicon nitride (SiN).

9. The method of claim 1, wherein one or more of the metal layer and the second metallization layer comprises molybdenum (Mo).

10. The method of claim 1, further comprising:
    before selectively depositing the barrier layer on the at least one sidewall of the top portion, pre-cleaning the metal layer to remove a native oxide from a top surface of the metal layer.

* * * * *